(12) United States Patent
Watanabe et al.

(10) Patent No.: US 7,211,332 B2
(45) Date of Patent: May 1, 2007

(54) LAMINATE

(75) Inventors: Hisashi Watanabe, Kimitsu (JP); Hiroshi Ito, Kimitsu (JP)

(73) Assignee: AMT Laboratory Co., Ltd., Yokkaichi-shi (JP)

( * ) Notice: Subject to any disclaimer, the term of this patent is extended or adjusted under 35 U.S.C. 154(b) by 0 days.

(21) Appl. No.: 11/370,920

(22) Filed: Mar. 9, 2006

(65) Prior Publication Data

US 2006/0204734 A1  Sep. 14, 2006

(30) Foreign Application Priority Data

Mar. 14, 2005   (JP) .............................. 2005-070658

(51) Int. Cl.
*B32B 15/04*   (2006.01)
*B32B 15/08*   (2006.01)
*B32B 15/18*   (2006.01)
*B32B 15/20*   (2006.01)

(52) U.S. Cl. ...................... 428/626; 428/674; 428/681; 428/458; 428/336; 428/220

(58) Field of Classification Search ................ 428/674, 428/681, 684, 680, 626, 212, 215, 220, 336, 428/335, 334, 332, 458
See application file for complete search history.

(56) References Cited

U.S. PATENT DOCUMENTS 5,536,584 A * 7/1996 Sotokawa et al. .......... 428/458

2003/0049487 A1 * 3/2003 Katsuki et al. ............. 428/626
2004/0105989 A1 * 6/2004 Ohta et al. ............... 428/473.5

FOREIGN PATENT DOCUMENTS

| JP | 60-243120 | 12/1985 |
| JP | 01-244841 | 9/1989 |
| JP | 09-174756 | 7/1997 |
| JP | 2002-240193 | 8/2002 |

* cited by examiner

*Primary Examiner*—Michael E. Lavilla
(74) *Attorney, Agent, or Firm*—Bacon & Thomas, PLLC

(57) ABSTRACT

A laminate having a metal foil layer, and a polyimide resin layer provided on the metal foil layer, wherein the polyimide resin layer is obtained by curing a coating of a polyimide resin precursor solution directly applied onto a surface of the metal foil layer, wherein the polyimide resin layer has a linear expansion coefficient in the range from 10 to 30 ppm/K, wherein the metal foil layer and the polyimide resin layer have a bonding strength therebetween of at least 0.5 kN/m in terms of 180° peel strength, and wherein the polyimide resin obtained from the polyimide resin precursor solution contains at least 50% by weight of a moiety having a structure represented by the following formula (1) shown in the specification.

7 Claims, No Drawings

LAMINATE

CROSS-REFERENCE TO RELATED APPLICATION

This application claims, under 35 USC 119, priority of Japanese Patent Application No. 2005-070658, filed Mar. 14, 2005, disclosures of which, inclusive of the specifications and claims, are hereby incorporated by reference herein.

BACKGROUND OF THE INVENTION

1. Field of the Invention

This invention relates to a laminate suitably used for the production of flexible wiring boards, circuit substrates for TAB and HDD suspensions.

2. Description of Prior Art

Various laminates having a metal layer and a heat resistant polymer layer such as a polyimide resin layer have been proposed for use in flexible wiring boards and HDD suspensions. For example, Japanese Unexamined Patent Publication (Kokai publication) No. JP-A-S60-243120 discloses a substrate for flexible wiring boards having an insulating layer containing a specific polyimide compound and a metal foil. The Japanese Kokai publication does not mention the bonding strength between the insulating layer and the metal foil. In fact, the laminate is apt to cause delamination of a circuit formed by etching the metal foil.

Japanese Kokai publication No. JP-A-H09-174756 discloses a polyimide-metal foil composite film in which a polyimide, obtained by reaction of pyromellitic dianhydride with m-tolidine and a diamino compound selected from 4,4'-diaminodiphenyl ether, 4,4'-diaminodiphenyl thioether, 2,2-bis[4-(4-aminophenoxy)phenyl]propane, 4,4'-diaminodiphenylpropane and 2,2-bis[4-(4-aminophenoxy)phenyl]hexafluoropropane, is directly coated over the metal foil. The laminate of the Japanese Kokai publication has good flatness and dimensional stability. However, no attention is paid concerning the bonding strength between the insulating layer and the metal foil in the invention. In fact, the bonding strength of the known laminate is not satisfactory.

Japanese Kokai publications No. JP-A-H01-244841 and No. JP-A-2002-240193 disclose a laminate having a metal foil, a first polyimide layer and a second polyimide layer. The second polyimide layer has a linear expansion coefficient similar to the metal foil. To improve the adhesion between the second polyimide resin layer and the metal foil, the first polyimide layer having good adhesion property to both the metal foil and the second polyimide layer is interposed therebetween. Because a plurality of polyimide resin layers should be formed, a specific production equipment must be used or repeated coating steps must be employed, so that the production efficiency is reduced.

Further, when the polyimide layers are etched with an alkaline etching liquid, satisfactory etching pattern is not easily obtainable because the etching speeds of the polyimide layers are different.

SUMMARY OF THE INVENTION

It is, therefore, the prime object of the present invention to provide a laminate in which a metal foil layer is directly bonded to a polyimide resin layer, in which the polyimide resin layer has a linear expansion coefficient similar to that of the metal foil layer, and in which the bonding strength of the metal foil layer and the polyimide resin layer is high.

Another object of the present invention is to provide a laminate of the above-mentioned type which is suitably used for the manufacture of flexible printed wiring boards and suspensions for HDD, which is free of curling and delamination and which permits the formation of excellent etching pattern.

It is a further object of the present invention to provide a method of producing a laminate of the above-mentioned type.

In accomplishing the foregoing object, there is provided in accordance with the present invention a laminate comprising a metal foil layer, and a polyimide resin layer provided on said metal foil layer, wherein said polyimide resin layer is obtained by curing a coating of a polyimide resin precursor solution directly applied onto a surface of said metal foil layer, wherein said polyimide resin layer has a linear expansion coefficient in the range from 10 to 30 ppm/K, wherein said metal foil layer and said polyimide resin layer have a bonding strength therebetween of at least 0.5 kN/m in terms of 180° peel strength, and wherein said polyimide resin obtained from said polyimide resin precursor solution contains at least 50% by weight of a moiety having a structure represented by the following formula (1):

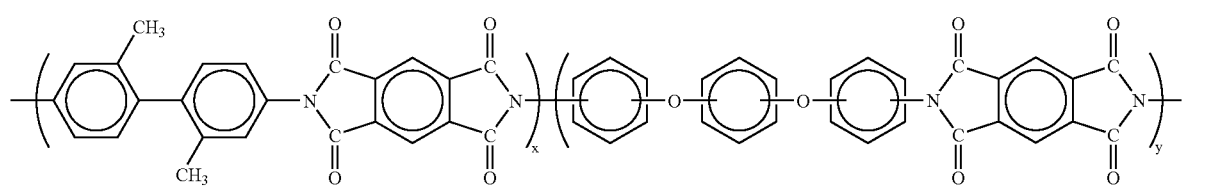

wherein x and y each represent a molar fraction and satisfy the conditions of x+y=100, 60≦x≦90 and 10≦y≦40.

In another aspect, the present invention provides a method for preparing a laminate having a metal foil layer and a polyimide resin layer provided on said metal foil layer, comprising the steps of:

reacting a diamine comprising 4,4'-diamino-2,2'-dimethylbiphenyl and bisaminophenoxybenzene with a tetracarboxylic dianhydride comprising pyromellitic dianhydride in a polar organic solvent to obtain a polyamic acid solution, wherein a total amount of said 4,4'-diamino-2,2'-dimethylbiphenyl and bisaminophenoxybenzene is at least 50% by weight based on the weight of said diamine and an amount of said pyromellitic dianhydride is at least 50% by weight based on the weight of said tetracarboxylic dianhydride, applying the polyamic acid solution directly over a metal foil to form a coating thereon, drying the coating, and imidizing the dried coating.

Other objects, features and advantages of the present invention will become apparent from the detailed description of the preferred embodiments to follow.

DETAILED DESCRIPTION OF THE PREFERRED EMBODIMENTS OF THE INVENTION

A laminate according to the present invention comprises a metal foil layer, and a polyimide resin layer provided on the metal foil layer. The metal foil layer serves to function as an electrically conductive layer and/or as a substrate while the polyimide film layer serves to function as an insulating layer.

The metal foil layer may be any customarily employed metal foil or metal alloy foil such as a copper foil, a stainless steel foil, an aluminum foil or a nichrome foil. Above all, a copper foil or a stainless steel foil is particularly preferably used. The copper foil has a high electric conductivity and can easily give a circuit wiring by etching with an etching liquid such as an aqueous ferric chloride solution. The copper foil may be a rolled copper foil or an electrolytic copper foil. The term "copper foil" as used herein is intended to include a foil consisting of copper or a copper alloy foil containing at least 90% by weight of copper and up to 10% by weight of one or more metals such as nickel, silicon, beryllium and zirconium. A laminate of the present invention using a copper foil as a metal foil layer is suitably used as a flexible printed wiring board or a circuit substrate for tape automated bonding (TAB). The stainless steel foil has excellent spring characteristics and can be easily etched with an etching liquid such as an aqueous ferric chloride solution. A laminate of the present invention using a stainless steel foil as a metal foil layer is suitably used as HDD suspension.

The metal foil layer preferably has a thickness of 5 to 40 μm, more preferably 8 to 30 μm, since wrinkles or breakage during formation of a polyimide resin layer thereon can be prevented and since the desired spring characteristics may be obtained when the laminate is used as HDD suspension.

The polyimide resin layer directly formed on the above metal foil layer is a layer of a specific polyimide resin obtained by curing a coating of a polyimide resin precursor solution directly applied onto a surface of the metal foil layer. The specific polyimide resin obtained by curing the polyimide resin precursor solution contains at least 50% by weight of a moiety having a structure represented by the following formula (1):

diamino-2,2'-dimethylbiphenyl and bisaminophenoxybenzene represented by the following formula (3):

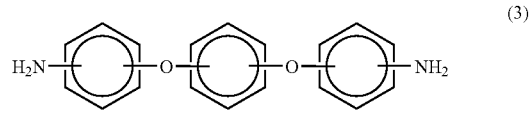

(3)

in an amount of at least 50% by weight, while the tetracarboxylic dianhydride should contain pyromellitic dianhydride in an amount of at least 50% by weight. Thus, the specific polyimide resin containing the moiety of the formula (1) may be produced by reacting the diamines and the tetracarboxylic dianhydride in an organic solvent to yield a polyamic acid which is a precursor of the polyimide resin. The above reaction is suitably carried out with a molar ratio of 4,4'-diamino-2,2'-dimethylbiphenyl to bisaminophenoxybenzene in the range of 90:10 to 60:40. By imidization of the precursor by heat treatment, the specific polyimide resin may be obtained.

In addition to the 4,4'-diamino-2,2'-dimethylbiphenyl and bisaminophenoxybenzene represented by the formula (3), the diamines may contain one or more other diamine compounds in an amount of 50% by weight or less for the purpose of improving the mechanical strengths, elasticity and etching characteristics of the polyimide resin layer. Examples of such other diamine compounds include p-phenylenediamine, m-phenylenediamine, 3,4'-diaminodiphenyl ether, 4,4'-diaminodiphenyl ether, 4,4'-diaminodiphenylmethane, 3,3'-dimethyl4,4'-diaminodiphenylmethane, 2,2-bis[4-(4-aminophenoxy)phenyl]propane, 2,2-bis[4-(4-aminophenoxy)phenyl]hexafluoropropane, diaminodiphenylsulfone, diaminobenzanilide, diaminotoluene and 4,4'-bis(4-aminophenoxy)biphenyl.

In addition to pyromellitic dianhydride, the tetracarboxylic dianhydride may contain one or more other tetracarboxylic dianhydride compounds in an amount of 50% by weight or less for the purpose of improving the mechanical

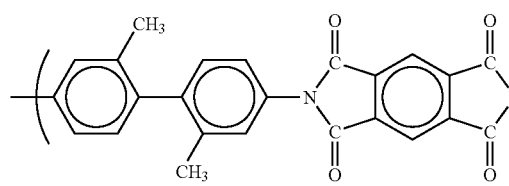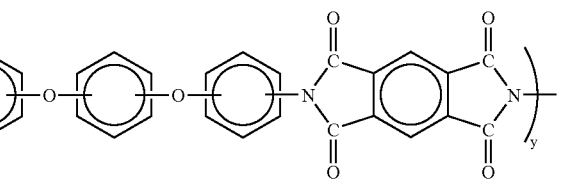

(1)

wherein x and y each represent a molar fraction and satisfy the conditions of x+y=100, 60≦x≦90 and 10≦y≦40.

The content of the moiety of the formula (1) in the specific polyimide resin is preferably at least 70% by weight, more preferably at least 80% by weight, particularly preferably 100% by weight, for reasons of obtaining a high bonding strength between the polyimide resin layer and the metal foil layer and capability of forming the desired etching pattern.

The specific polyimide resin containing the moiety of the formula (1) may be obtained from diamines and a tetracarboxylic dianhydride. The diamines should include 4,4'- strengths, elasticity and etching characteristics. Examples of such other tetracarboxylic dianhydride compounds include 3,3',4,4'-biphenyltetracarboxylic dianhydride, 3,3',4,4'-benzophenonetetracarboxylic dianhydride, 3,3',4,4'-diphenylsulfonetetracarboxylic dianhydride and 3,3',4,4'-diphenyl ether tetracarboxylic dianhydride.

The moiety of the formula (1) is preferably a moiety represented by the following formula (2) for reasons of obtaining a high bonding strength between the polyimide resin layer and the metal foil layer and excellent mechanical strengths of the polyimide resin layer:

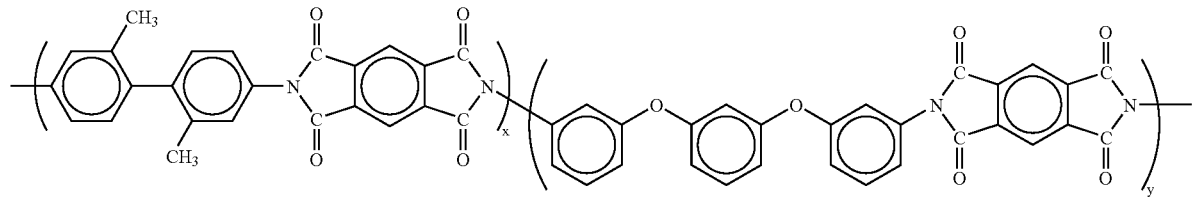

(2)

wherein x and y each represent a molar fraction and satisfy the conditions of x+y=100, 60≦x≦90 and 10≦y≦40. The moiety of the above formula (2) may be obtained by using 1,3-bis(3-aminophenoxy)benzene as the bisaminophenoxybenzene.

The laminate of the present invention may be obtained by directly applying a polyimide resin precursor solution (polyamic acid solution), obtained by reaction of the above-described specific diamines and specific tetracarboxylic dianhydride in an organic solvent, over a metal foil by casting or coating. The resulting coating is dried and cured to form a polyimide resin layer on the metal foil layer.

The organic solvent used in the polymerization is preferably a polar organic solvent such as N,N-dimethylacetamide, N-methylpyrrolidone or N,N-dimethylformamide.

The application of the polyimide precursor solution over a metal foil may be carried out by any conventionally employed manner using, for example, a die coater, a gravure coater, a knife coater, a reverse roll coater, a curtain flow coater or a bar coater.

The coating on the metal foil is generally dried at a temperature of at least 50° C., preferably at least 100° C., in an oven. The dried coating is cured for imidization at a temperature of at least 200° C., preferably at least 300° C., to form a polyimide resin layer on the metal foil.

The polyimide resin layer generally has a thickness of 1 to 100 μm, preferably 3 to 50 μm, more preferably 5 to 30 μm.

It is important that that the polyimide resin layer of the laminate of the present invention have a linear expansion coefficient in the range from 10 to 30 ppm/K in order to obtain a laminate which is free of curl and which permits a process of forming a wiring circuit including etching to be easily conducted without causing dimensional variation. The linear expansion coefficient of the polyimide resin layer in the range from 10 to 30 ppm/K means that the polyimide resin layer has a linear expansion coefficient similar to that of the metal foil. When the linear expansion coefficient is outside the above range, the laminate is apt to be curled and fine wiring patterns are not obtainable due to dimensional variation. The linear expansion coefficient is preferably 15 to 25 ppm/K.

As used herein, the linear expansion coefficient is measured using a thermomechanical analyzer (Model TMA-50 manufactured by Shimadzu Corporation). A sample is heated from room temperature to 250° C. and maintained at that temperature for 10 minutes. Then, the heated sample is cooled at a rate of 10° C./minute. An average coefficient of thermal expansion from 240° C. to 100° C. represents the linear coefficient of thermal expansion.

It is also important that the bonding strength between the metal foil layer and the polyimide resin layer should be at least 0.5 kN/m in terms of 180° peel strength. When the bonding strength is less than 0.5 kN/m, problems such as blister and delamination are apt to be caused during etching treatment of the metal foil layer or during high temperature treatment such as soldering treatment. The bonding strength is preferably at least about 1 kN/m.

As used herein, the bonding strength is measured as follows. The metal foil layer of a laminate is etched in the form of a linear circuit having a width of 2 mm. The polyimide resin layer of the etched sample is fixed to an aluminum plate having a thickness of 1 mm using a double-sided adhesive tape so that the linear circuit of the sample faces outward. The linear circuit is then peeled in the direction of 180° at a rate of 5 cm/minute to measure the peel strength.

The polyimide resin layer of the present invention is preferably a single layer for reasons of production efficiency. If desired, however, the polyimide resin layer is formed into a multi-layer structure. Such a multi-layered polyimide resin layer may be prepared by repeating twice or more times the above process including coating, drying and imidization. Alternatively, imidization may be carried out only once after repeating the coating and drying operations suitable times. Further, a plurality of superposed coatings can be simultaneously formed on a metal foil by using a multi-layered die and can be dried and imidized to obtain a multi-layered polyimide resin layer. In such a multi-layered polyimide resin layer, it is necessary that at least the layer in contact with the metal foil layer should be a layer of the above-described specific polyimide resin. The other layers which are not in direct contact with the metal foil layer may be or may not be made of the specific polyimide resin.

Another metal foil layer or a conductive layer may be provided on opposite side of the polyimide resin layer (which may be a single polyimide resin layer or a multi-layered polyimide resin layer) from the metal foil layer to obtain a laminate having a structure of metal foil layer/polyimide resin layer/metal foil layer or metal foil layer/polyimide resin layer/conductive layer.

Thus, in one preferred embodiment of the present invention, the laminate has a structure which includes a conductive layer formed on opposite side of the polyimide resin layer from the metal foil layer by sputtering or by a combination of sputtering and electroplating. The conductive layer may be utilized for the formation of a wiring pattern.

The sputtering layer formed on the polyimide resin layer is made of any conductive metal such as copper, nickel, chromium, titanium, molybdenum, tungsten or an alloy of two or more thereof. The sputtering layer may also have a multi-layer structure in which a first sputtering layer showing a high bonding strength to the polyimide resin layer, such as a nickel-chromium alloy layer or a nickel-chromium-copper alloy layer, is first formed on the polyimide layer with a second sputtering layer having a high conductivity, such as a copper layer, being superimposed on the first layer by sputtering. The sputtering layer generally has a thickness of 0.01 to 3 μm.

If desired, a surface of the polyimide resin layer on which a sputtering layer is to be formed may be subjected to a pretreatment, such as a plasma treatment, a corona treatment, a UV treatment or a chemical treatment, for activating the surface and for improving the bonding strength between the surface and the sputtering layer.

The sputtering layer may be overlaid with an electroplating layer such as a thick copper layer to improve the conductivity of the conductive layer. The electroplating electrolyte solution containing an aqueous copper sulfate solution as its major component may be suitably used to form such a copper layer. The electroplating layer generally has a thickness of 0.1 to 50 µm.

The metal foil layer and/or the conductive layer (sputtering layer or sputtering-and-electroplating layer) of the laminate may be etched by any suitable known method, for example, a subtractive method using an etching liquid such as an aqueous ferric chloride solution, to form a circuit pattern. The resulting laminate may be suitably used as, for example, a flexible wiring board. In this case, the conductive layer generally has a thickness of at least 5 µm.

The conductive layer of the laminate may also be used as a seed layer for forming a fine wiring pattern by the semiadditive method which typically includes applying a photosensitive plating resist over the seed layer, followed by imaging, developing, electroplating, and stripping. In this case, the conductive layer generally has a thickness of less than 5 µm.

The laminate of the present invention, in which a stainless steel foil layer is used as the metal foil layer and a conductive layer (sputtering layer or sputtering-and-electroplating layer) is formed on opposite side of the polyimide resin layer from the stainless steel foil layer, may be suitably used for forming a HDD suspension. In this case, the stainless steel foil layer is etched with an aqueous ferric chloride solution while the conductive layer is processed by the subtractive method or semiadditive method to form a circuit pattern.

The following examples and comparative examples will further illustrate the present invention. The abbreviations used in the examples are as follows:

DADMB: 4,4'-diamino-2,2'dimethylbiphenyl
APB-m: 1,3-bis(3-aminophenoxy)benzene
APB-p: 1,3-bis(4-aminophenoxy)benzene
DAPE: 4,4'-diaminodiphenyl ether
PMDA: pyromellitic dianhydride
BPDA: 3,3',4,4'-biphenyltetracarboxylic dianhydride
DMAc: N,N-dimethylacetamide

SYNTHESIS EXAMPLE 1

In a separable flask equipped with a stirring rod, 0.075 mol (15.92 g) of DADMB and 0.025 mol (7.31 g) of APB-m were dissolved in 254 g of DMAc. With stirring 0.099 mol (21.59 g) of PMDA was added to the resulting solution to perform the polymerization, thereby obtaining a viscous, polyimide resin precursor solution (A).

SYNTHESIS EXAMPLE 2

In a separable flask equipped with a stirring rod, 0.080 mol (16.98 g) of DADMB, 0.010 mol (2.92 g) of APB-p and 0.010 mol (2.92 g) of APB-m were dissolved in 241 g of DMAc. With stirring 0.09 mol (19.63 g) of PMDA and 0.009 mol (2.65 g) of BPDA were added to the resulting solution to perform the polymerization, thereby obtaining a viscous, polyimide resin precursor solution (B).

SYNTHESIS EXAMPLE 3

In a separable flask equipped with a stirring rod, 0.09 mol (19.11 g) of DADMB and 0.01 mol (2.92 g) of APB-m were dissolved in 247 g of DMAc. With stirring 0.099 mol (21.59 g) of PMDA was added to the resulting solution to perform the polymerization, thereby obtaining a viscous, polyimide resin precursor solution (C).

SYNTHESIS EXAMPLE 4

In a separable flask equipped with a stirring rod, 0.1 mol (29.24 g) of APB-m was dissolved in 288 g of DMAc. With stirring 0.099 mol (21.59 g) of PMDA was added to the resulting solution to perform the polymerization, thereby obtaining a viscous, polyimide resin precursor solution (D).

SYNTHESIS EXAMPLE 5

In a separable flask equipped with a stirring rod, 0.075 mol (15.92 g) of DADMB and 0.025 mol (5.01 g) of DAPE were dissolved in 241 g of DMAc. With stirring 0.099 mol (21.59 g) of PMDA was added to the resulting solution to perform the polymerization, thereby obtaining a viscous, polyimide resin precursor solution (E).

EXAMPLE 1

The polyimide resin precursor solution (A) obtained in Synthesis Example 1 was applied over an electrolytic copper foil (CF-T9 FOIL manufactured by Fukuda Metal Foil & Powder Co., Ltd.) to a thickness after curing of 25 µm. The coated product was dried at 110° C. for 10 minutes and at 130° C. for 20 minutes and then further heat-treated for imidization at 160° C., 200° C., 250° C., 320° C. and 380° C. each for 2 minutes to obtain a laminate composed of a polyimide resin layer and an electrolytic copper foil layer.

The laminate was substantially flat and showed a bonding strength between the polyimide resin layer and electrolytic copper foil layer of 1.5 kN/m. No blister, delamination or other abnormal conditions were observed, even when the laminate was immersed in a solder bath at 300° C.

The linear expansion coefficient of the polyimide film obtained by etching the copper foil with an aqueous ferric chloride solution was found to be 24 ppm/K.

EXAMPLE 2

Example 1 was repeated in the same manner as described except that the polyimide resin precursor solution (B) obtained in Synthesis Example 2 was substituted for the polyimide resin precursor solution (A) and that the thickness of the coating after curing was 12 µm, thereby obtaining a laminate composed of a polyimide resin layer and an electrolytic copper foil layer.

The laminate was substantially flat and showed a bonding strength between the polyimide resin layer and electrolytic copper foil layer of 1.2 kN/m. No blister, delamination or other abnormal conditions were observed, even when the laminate was immersed in a solder bath at 300° C.

The linear expansion coefficient of the polyimide film obtained by etching the copper foil with an aqueous ferric chloride solution was found to be 22 ppm/K.

EXAMPLE 3

Example 1 was repeated in the same manner as described except that the polyimide resin precursor solution (C) obtained in Synthesis Example 3 was substituted for the polyimide resin precursor solution (A) and that a stainless steel foil with a thickness of 20 µm was substituted for the electrolytic copper foil with a thickness of 12 μm, thereby obtaining a laminate composed of a polyimide resin layer and a stainless steel foil layer.

The laminate was substantially flat and showed a bonding strength between the polyimide resin layer and electrolytic copper foil layer of 1.1 kN/m. No blister, delamination or other abnormal conditions were observed, even when the laminate was immersed in a solder bath at 300° C.

The linear expansion coefficient of the polyimide film obtained by etching the stainless foil with an aqueous ferric chloride solution was found to be 17 ppm/K.

EXAMPLE 4

The polyimide resin precursor solution (A) obtained in Synthesis Example 1 was applied over stainless steel foil (manufactured by Toyo Seihaku Co., Ltd., SUS304, tension-annealed product, thickness: 20 μm) to a thickness after curing of 10 μm. The coated product was dried at 110° C. for 4 minutes and at 130° C. for another 4 minutes and then further heat-treated for imidization at 160° C., 200° C., 250° C., 320° C. and 380° C. each for 2 minutes to obtain a laminate composed of a polyimide resin layer and a stainless steel foil layer.

The polyimide resin layer of the laminate was subjected to sputtering using a vacuum sputtering apparatus to successively deposit an alloy layer (nickel: 80%, chromium: 20%) with a thickness of 20 nm and a copper layer having a thickness of 300 nm, thereby obtaining a laminate having a structure of stainless steel layer/polyimide layer/sputtering conductive layer.

The bonding strength between the polyimide resin layer and the stainless steel foil layer of the laminate was found to be 1.8 kN/m. The linear expansion coefficient of the polyimide film was found to be 21 ppm/K.

Electroplating was carried out to form a copper layer having a thickness of 8 μm on the sputtering conductive layer, thereby obtaining a laminate having a structure of stainless steel layer/polyimide layer/sputtering conductive layer/electroplating conductive layer. The bonding strength between the polyimide resin layer and the conductive layer of the laminate was found to be 1.1 kN/m. No blister, delamination or other abnormal conditions were observed, even when the laminate was immersed in a solder bath at 300° C.

EXAMPLE 5

The polyimide resin precursor solution (C) obtained in Synthesis Example 3 was applied over stainless steel foil (manufactured by Toyo Seihaku Co., Ltd., SUS304, tension-annealed product, thickness: 15 μm) to a thickness after curing of 6 μm. The coated product was dried at 110° C. for 4 minutes and at 130° C. for another 4 minutes and then further heat-treated for imidization at 160° C., 200° C., 250° C., 320° C. and 380° C. each for 2 minutes to obtain a laminate composed of a polyimide resin layer and a stainless steel foil layer.

The polyimide resin layer of the laminate was subjected to sputtering using a vacuum sputtering apparatus to successively deposit an alloy layer (nickel: 40%, chromium: 10%, copper: 50%) with a thickness of 20 nm and a copper layer having a thickness of 300 nm and to form a conductive layer. Thereafter electroplating was carried out to form a copper layer having a thickness of 8 μm on the sputtering conductive layer, thereby obtaining a laminate having a structure of stainless steel layer/polyimide layer/sputtering conductive layer/electroplating conductive layer.

The bonding strength between the stainless steel foil layer and the polyimide resin layer was found to be 1.6 kN/m, while the bonding strength between the polyimide resin layer and the conductive layer was 1.0 kN/m. The linear expansion coefficient of the polyimide film was found to be 18 ppm/K. No blister, delamination or other abnormal conditions were observed, even when the laminate was immersed in a solder bath at 300° C.

COMPARATIVE EXAMPLE 1

Example 1 was repeated in the same manner as described except that the polyimide resin precursor solution (D) obtained in Synthesis Example 4 was substituted for the polyimide resin precursor solution (A), thereby obtaining a laminate composed of a polyimide resin layer and an electrolytic copper foil layer.

The laminate showed a bonding strength between the polyimide resin layer and electrolytic copper foil layer of 1.5 N/m. However, the linear expansion coefficient was so high (45 ppm/K) that a curl with a radius of curvature of about 2 cm was formed with the polyimide resin layer on the inside.

COMPARATIVE EXAMPLE 2

Example 3 was repeated in the same manner as described except that the polyimide resin precursor solution (E) obtained in Synthesis Example 5 was substituted for the polyimide resin precursor solution (C), thereby obtaining a laminate composed of a polyimide resin layer and a stainless steel foil layer. The laminate was substantially flat. The linear expansion coefficient of the polyimide film was 23 ppm/K. Since the bonding strength between the polyimide resin layer and the stainless steel foil layer was so low (0.2 kN/m), that a blister was found to be formed when the laminate was immersed in a solder bath at 300° C.

In the above Examples and Comparative Examples, the linear expansion coefficient and the bonding strength were measured in the manner described previously.

The invention may be embodied in other specific forms without departing from the spirit or essential characteristics thereof. The present embodiments are therefore to be considered in all respects as illustrative and not restrictive, the scope of the invention being indicated by the appended claims rather than by the foregoing description, and all the changes which come within the meaning and range of equivalency of the claims are therefore intended to be embraced therein.

What is claimed is:

1. A laminate comprising a metal foil layer, and a polyimide resin layer provided on said metal foil layer, wherein said polyimide resin layer is obtained by curing a coating of a polyimide resin precursor solution directly applied onto a surface of said metal foil layer, wherein said polyimide resin layer has a linear expansion coefficient in the range from 10 to 30 ppm/K, at a temperature range of from 240 to 100° C. wherein said metal foil layer and said polyimide resin layer have a bonding strength therebetween of at least 0.5 kN/m in terms of 180° peel strength, and wherein said polyimide resin obtained from said polyimide resin precursor solution contains at least 50 % by weight of a moiety having a structure represented by the following formula (2):

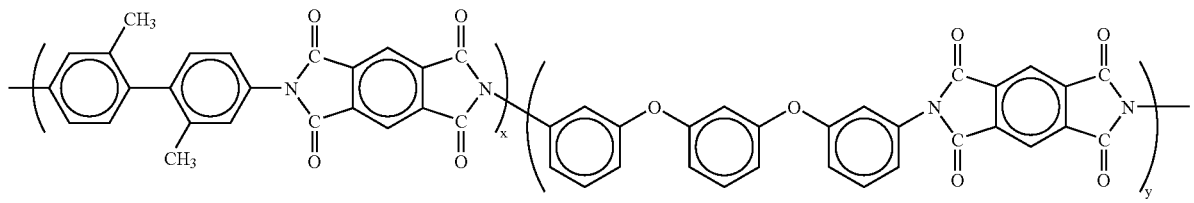

(2)

wherein x and y each represent a molar fraction and satisfy the following conditions: x+y=100, 60≦x≦90 and 10≦y≦40.

2. A laminate as claimed in claim 1, wherein said metal foil layer is a layer of a copper foil.

3. A laminate as claimed in claim 1, wherein said metal foil layer is a layer a stainless steel foil.

4. A laminate as claimed in claim 1, wherein said metal foil layer and said polyimide resin layer have thicknesses of 5 to 40 μm and 1 to 100 μm, respectively.

5. A laminate as claimed in claim 1, further comprising a conductive layer provided on a surface of said polyimide resin layer and having a thickness of 0.01 to 3 μm, said conductive layer being formed by sputtering.

6. A laminate as claimed in claim 5, further comprising a copper layer provided on said conductive layer by electroplating and having a thickness of 0.1 to 50 μm.

7. A laminate as claimed in claim 5, wherein said conductive layer comprises a first sputtered layer of a nickel/chromium alloy or a nickel/chromium/copper alloy, and a second sputtered layer of copper formed on said first sputtered layer.

* * * * *